(12) United States Patent
Nie

(10) Patent No.: US 12,009,366 B2
(45) Date of Patent: Jun. 11, 2024

(54) ARRAY SUBSTRATE, MANUFACTURING METHOD THEREOF, AND DISPLAY DEVICE

(71) Applicant: WUHAN CHINA STAR OPTOELECTRONICS TECHNOLOGY CO., LTD., Hubei (CN)

(72) Inventor: Xiaohui Nie, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 968 days.

(21) Appl. No.: 16/970,808

(22) PCT Filed: Jun. 12, 2020

(86) PCT No.: PCT/CN2020/095778
§ 371 (c)(1),
(2) Date: Aug. 18, 2020

(87) PCT Pub. No.: WO2021/227173
PCT Pub. Date: Nov. 18, 2021

(65) Prior Publication Data
US 2023/0120385 A1    Apr. 20, 2023

(30) Foreign Application Priority Data
May 12, 2020  (CN) .......................... 202010398144.2

(51) Int. Cl.
*H01L 27/12*     (2006.01)
*G09G 3/00*      (2006.01)

(52) U.S. Cl.
CPC ........ *H01L 27/124* (2013.01); *H01L 27/1259* (2013.01); *G09G 3/006* (2013.01); *G09G 2330/12* (2013.01)

(58) Field of Classification Search
None
See application file for complete search history.

(56) References Cited

U.S. PATENT DOCUMENTS

| 6,133,582 A | * | 10/2000 | Osann, Jr. | ......... | H01L 27/11803 |
| | | | | | 324/759.03 |
| 6,399,400 B1 | * | 6/2002 | Osann, Jr. | ......... | H01L 27/11803 |
| | | | | | 257/E27.107 |
| 6,514,780 B2 | * | 2/2003 | Manyoki | ................ | H01L 22/34 |
| | | | | | 438/18 |

FOREIGN PATENT DOCUMENTS

| CN | 1391132 A | 1/2003 |
| CN | 106782241 A | 5/2017 |
| CN | 109307961 A | 2/2019 |
| CN | 110189666 A | 8/2019 |
| CN | 110189671 A | 8/2019 |
| CN | 110289225 A | 9/2019 |
| CN | 111128080 A | 5/2020 |

* cited by examiner

*Primary Examiner* — Long Pham
(74) *Attorney, Agent, or Firm* — PV IP PC; Wei Te Chung; Zhigang Ma

(57) ABSTRACT

An array substrate, a manufacturing method thereof, and a display device are provided. The array substrate includes a terminal region. A testing electric circuit wiring is disposed in the terminal region. The testing electric circuit wiring includes a first metal layer, a second metal layer, and a third metal layer.

10 Claims, 3 Drawing Sheets

ARRAY SUBSTRATE, MANUFACTURING METHOD THEREOF, AND DISPLAY DEVICE

FIELD OF INVENTION

The present disclosure relates to the display field, and particularly relates to an array substrate, a manufacturing method thereof, and a display device.

BACKGROUND OF INVENTION

A main R&D direction of advanced-level small and medium-sized low-temperature poly-Si (LTPS) display panels is higher screen-to-body ratio and extremely narrow bezels. For implementation of the narrow bezels, on one hand, production processes need to be optimized to improve accuracy; on the other hand, product designs need to be optimized, and this continuously compresses space between structural units.

In order to effectively detect whether display functions of the small and medium-sized LTPS display panels are fine, testing electric circuit wirings (test circuits) are generally disposed on terminal regions of array substrates. A plurality of groups of testing pads are designed in the test circuits. When an array substrate and a color film substrate are assembled to form a cell, a probe jig is utilized to input testing signals into the testing pads to light up the panel, so as to realize the purpose of detecting defectiveness of the display functions.

In order to prevent switch devices of the array substrates from destruction incurred by static electricity between a contact of the probe jig and the testing pad in an instant, wire wound resistors are generally introduced into the test circuits. In traditional designs, the wire wound resistors are disposed above the testing pads, occupying larger space and resulting in larger bottom bezels of the display panels.

A purpose of the present disclosure is to solve technical problems of larger dimensions of the bottom bezels of current display devices and unsatisfactory screen-to-body ratio of the display devices.

SUMMARY OF INVENTION

In order to realize the purpose mentioned above, the present disclosure provides an array substrate including a terminal region. A testing electric circuit wiring is disposed in the terminal region. The testing electric circuit wiring includes a first metal layer configured to act as a light shielding layer and a signal transmitting line for testing electric current, a second metal layer configured to act as a gate electrode wiring and, a third metal layer configured to act as a testing electric circuit. Furthermore, the second metal layer is connected to the first metal layer, and the third metal layer is connected to the first metal layer.

Furthermore, the array substrate further includes a base substrate, wherein the first metal layer is disposed on a surface of a side of the base substrate, and the first metal layer is in a winding-type; a buffer layer disposed on a surface of a side of the first metal layer away from the base substrate; an insulating layer disposed on a surface of a side of the buffer layer away from the first metal layer; the second metal layer disposed on a surface of a side of the buffer layer away from the first metal layer; a dielectric layer disposed on a surface of a side of the second metal layer away from the buffer layer; and the third metal layer disposed on a surface of a side of the dielectric layer away from the buffer layer.

Furthermore, a plurality of buffer layer via holes are defined on the buffer layer. A plurality of insulating layer via holes are defined on the insulating layer. The plurality of insulating layer via holes and the plurality of buffer layer via holes are defined relatively. A plurality of dielectric layer via holes are defined on the dielectric layer. The plurality of dielectric layer via holes and the plurality of insulating layer via holes are defined relatively.

Furthermore, one of the buffer layer via holes and one of the insulating layer via holes defined relatively are communicated with each other to form a first via hole, and one of the another buffer layer via holes, another one of the insulating layer via holes, and one of the dielectric layer via holes defined relatively are communicated with each other to form a second via hole.

Furthermore, internal diameters of the buffer layer via holes are less than internal diameters of the insulating layer via holes, and the internal diameters of the insulating layer via holes are less than internal diameters of the dielectric layer via holes.

Furthermore, the second metal layer is partially disposed in the first via hole and connected to the first metal layer, and the third metal layer is partially disposed in the second via hole and connected to the first metal layer.

In order to realize the purpose mentioned above, the present disclosure further provides a manufacturing method of the array substrate to manufacture the array substrate mentioned above, which includes following steps: providing a base substrate in a step of providing the base substrate; manufacturing a first metal layer on a top surface of the base substrate in a step of manufacturing the first metal layer, wherein the first metal layer is in a winding-type; manufacturing a buffer layer on a top surface of the first metal layer in a step of manufacturing the buffer layer; manufacturing an insulating layer on a top surface of the buffer layer in a step of manufacturing the insulating layer; manufacturing a second metal layer on a top surface of the insulating layer in a step of manufacturing the second metal layer; manufacturing a dielectric layer on a top surface of the second metal layer in a step of manufacturing the dielectric layer; and manufacturing a third metal layer on a top surface of the dielectric layer in a step of manufacturing the third metal layer, wherein the third metal layer, the second metal layer, and the first metal layer constitute a testing electric circuit wiring.

Furthermore, in the step of manufacturing the buffer layer, a layer of a buffer material is deposited on the top surface of the first metal layer, at least one buffer layer via hole is defined by using exposure and etching technology, and part of the first metal layer is exposed in the buffer layer via hole; in the step of manufacturing the insulating layer, a layer of an insulation material is deposited on the top surface of the buffer layer, at least one insulating layer via hole is defined on the buffer layer via hole by using the exposure and etching technology, the insulating layer via hole is communicated with the buffer layer via hole, and the insulating layer via hole and the buffer layer via hole form a first via hole; and in the step of manufacturing the second metal layer, the second metal layer is manufactured in the first via hole, and the second metal layer is connected to the first metal layer.

Furthermore, in the step of manufacturing the dielectric layer, a layer of an inorganic material is deposited on the top surfaces of the insulating layer and the second metal layer, a dielectric layer via hole is defined on the insulating layer via hole by using the exposure and etching technology, and the dielectric layer via hole is communicated with the insulating layer via hole, and the dielectric layer via hole, the insulating layer via hole, and the buffer layer via hole form a second via hole; and in a step of manufacturing the third metal layer, the third metal layer is manufactured in the second via hole, and the third metal layer is connected to the first metal layer.

In order to realize the purpose mentioned above, the present disclosure further provide s a display device including the array substrate mentioned above.

The beneficial effect of the present disclosure is to manufacture a wire wound resistor from the first metal layer to replace a wire wound resistor of the original second metal layer, so that the second metal layer only needs to be electrically connected to the first metal layer, reducing an accommodating space of the testing electric circuit wiring, further reducing a width of the bottom bezel of the display device, reducing an area of a non-display region of the display device, and improving the screen-to-body ratio of the display device.

DESCRIPTION OF DRAWINGS

The technical solutions and other advantageous effects of the present invention will be apparent with reference to the following accompanying drawings and detailed description of embodiments of the present disclosure.

Figure 1:
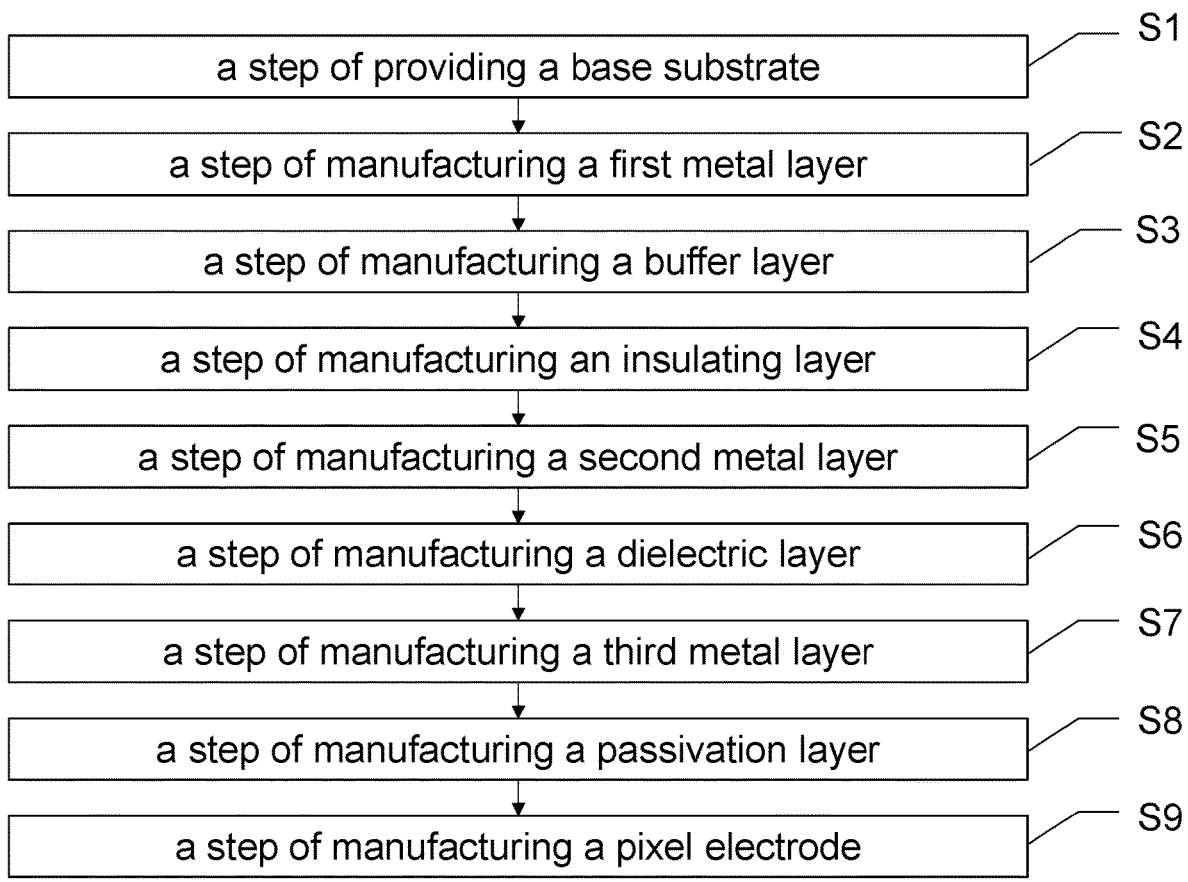
FIG. 1 is a flowchart of a manufacturing method of an array substrate of an embodiment of the present disclosure.
Figure 2:
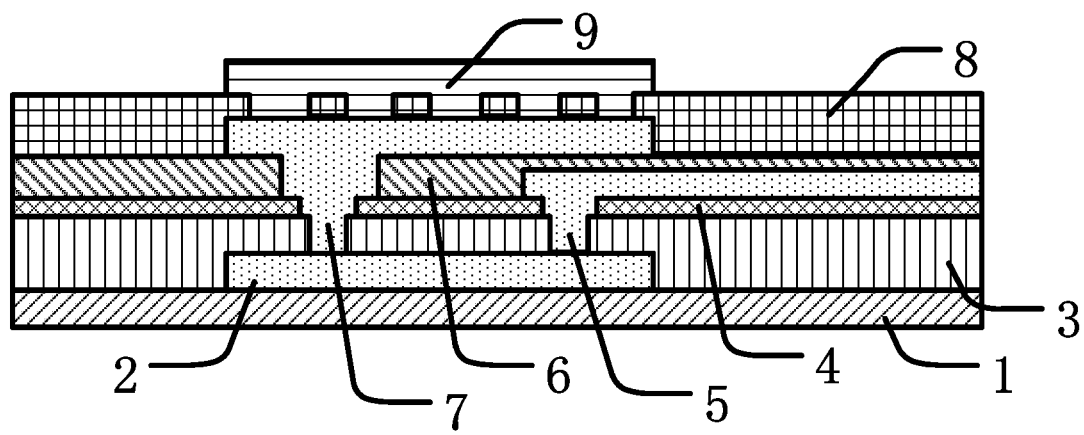
FIG. 2 is a structural schematic diagram of the array substrate of an embodiment of the present disclosure.
Figure 3:
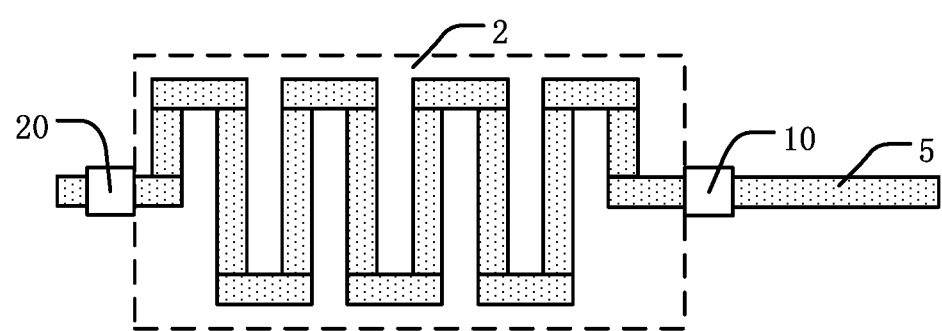
FIG. 3 is a partial top view of the array substrate of an embodiment of the present disclosure.
Figure 4:
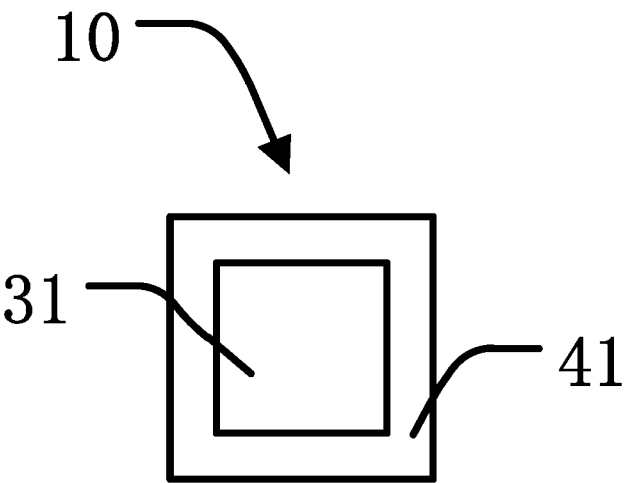
FIG. 4 is a schematic diagram of a first via hole of an embodiment of the present disclosure.
Figure 5:
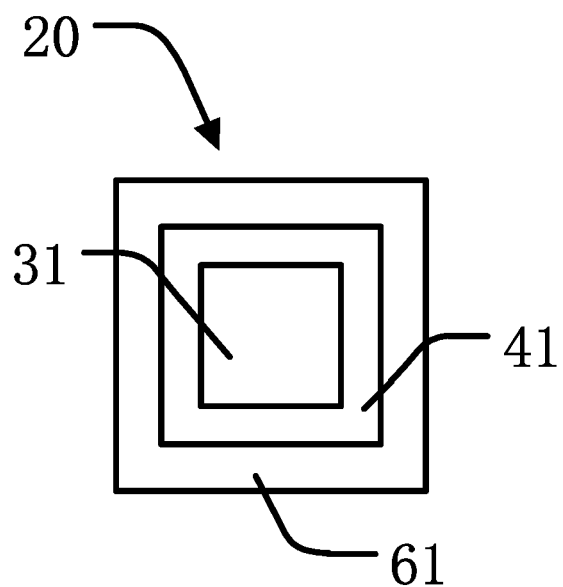
FIG. 5 is a schematic diagram of a second via hole of an embodiment of the present disclosure.

Some components are indicated as follows:
1, base substrate; 2, first metal layer; 3, buffer layer; 4, insulating layer; 5, second metal layer; 6, dielectric layer; 7, third metal layer; 8, passivation layer; 9, pixel electrode 10, first via hole; 20, second via hole;

31, buffer layer via hole; 41, insulating layer via hole; 61, dielectric layer via hole.

DETAILED DESCRIPTION OF PREFERRED EMBODIMENTS

The technical solutions in the embodiments of the present disclosure are clearly and completely described in the following with reference to the accompanying drawings in the embodiments of the present disclosure. Obviously, the described embodiments are only part of the embodiments of the present disclosure, but are not all embodiments of the present disclosure. All other embodiments obtained by those skilled in the art based on the embodiments of the present disclosure without creative efforts are within the scope of the present disclosure.

In the description of the present disclosure, it is to be understood that the orientation or positional relationship indicated by the terms "center", "longitudinal", "transverse", "length", "width", "thickness", "upper", "lower", "front", "rear", "left", "right", "vertical", "horizontal", "top", "bottom", "inside", "outside", "clockwise", "counterclockwise" etc. is based on the orientation or positional relationship shown in the accompanying figures, which is merely for the convenience for describing the present disclosure and for the simplification of the description, and is not intended to indicate or imply that the indicated devices or elements have a specific orientation or is constructed and operated in a specific orientation. Therefore, it should not be understood as a limitation on the present disclosure. Moreover, the terms "first" and "second" are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly. In the description of the present disclosure, the meaning of "a plurality" is two or more unless clearly and specifically defined otherwise.

In the description of the present disclosure, unless specified or limited otherwise, terms "mounted," "connected," "coupled," and the like are used in a broad sense, and may include, for example, fixed connections, detachable connections, or integral connections; may also be mechanical or electrical connections or may be communication between each other; may also be direct connections or indirect connections via intervening structures; may also be inner communications of two elements or may be a relationship of interaction between two elements. For persons skilled in the art in this field, the specific meanings of the above terms in the present disclosure can be understood with specific cases.

In the present disclosure, unless expressly specified or limited otherwise, a first feature is "on" or "beneath" a second feature may include that the first feature directly contacts the second feature and may also include that the first feature does not directly contact the second feature. Furthermore, a first feature "on," "above," or "on top of" a second feature may include an embodiment in which the first feature is right "on," "above," or "on top of" the second feature and may also include that the first feature is not right "on," "above," or "on top of" the second feature, or just means that the first feature has a sea level elevation higher than the sea level elevation of the second feature. While first feature "beneath," "below," or "on bottom of" a second feature may include that the first feature is "beneath," "below," or "on bottom of" the second feature and may also include that the first feature is not right "beneath," "below," or "on bottom of" the second feature, or just means that the first feature has a sea level elevation lower than the sea level elevation of the second feature.

The following disclosure provides many different embodiments or examples for implementing the different structures of the present disclosure. In order to simplify the disclosure of the present disclosure, the components and configurations of the specific examples are described below. Of course, they are merely examples and are not intended to limit the present disclosure. In addition, the present disclosure may repeat reference numerals and/or reference numerals in different examples, which are for the purpose of simplicity and clarity, and do not indicate the relationship between the various embodiments and/or arrangements discussed. Moreover, the present disclosure provides embodiments of various specific processes and materials, but one of ordinary skill in the art will recognize the use of other processes and/or the use of other materials.

Specifically, please refer to FIG. 1, the present disclosure provides a manufacturing method of an array substrate, including steps S1 to S9.

S1, a step of providing a base substrate, wherein the base substrate is provided. The base substrate exerts a substrate function and is generally a hard substrate such as a glass substrate.

S2, a step of manufacturing a first metal layer, wherein the first metal layer is manufactured on a top surface of the base substrate by an exposure and etching technology and patterning process. When a light shielding layer pattern of a poly-Si channel of a thin film transistor (TFT) of a display region is manufactured, the first metal layer is manufactured into a wire wound resistor simultaneously. The first metal layer acts as the light shielding layer of the poly-Si channel of the TFT, and acts as a signal transmitting line for testing electric current.

S3, a step of manufacturing a buffer layer, wherein the buffer layer is manufactured on a top surface of the first metal layer. Specifically, a layer of a buffer material is deposited on the top surface of the first metal layer by using a chemical vapor deposition method. At least one buffer layer via hole is defined by using exposure and etching technology, making part of the first metal layer needed to be electrically connected be exposed in the buffer layer via hole.

S4, a step of manufacturing an insulating layer, wherein the insulating layer is manufactured on a top surface of the buffer layer. The insulating layer is a gate insulator layer. Specifically, a layer of an insulation material is deposited on the top surface of the buffer layer by the chemical vapor deposition method. At least one insulating layer via hole is defined on the buffer layer via hole by using the exposure and etching technology.

The insulating layer via hole and the buffer layer via hole are disposed relatively. The insulating layer via hole and the buffer layer via hole are a nested structure, that is, the insulating layer via hole is communicated with the buffer layer via hole. An internal diameter of the insulating layer via hole is greater than an internal diameter of the buffer layer via hole, and the insulating layer via hole and the buffer layer via hole form a first via hole, that is, the first via hole is a ladder-shaped via hole with a larger top internal diameter and a smaller bottom internal diameter. The first via hole provides a connection channel for a subsequent second metal layer.

S5, a step of manufacturing the second metal layer, wherein the second metal layer is manufactured on a top surface of the insulating layer and in the first via hole by a physical vapor deposition method. The second metal layer penetrates the first via hole and is electrically connected to the first metal layer. The second metal layer acts as a gate electrode wiring.

S6, a step of manufacturing a dielectric layer, wherein the dielectric layer is manufactured on a top surface of the second metal layer. Specifically, a layer of an inorganic material is deposited on the top surfaces of the insulating layer and the second metal layer by the chemical vapor deposition method, and a dielectric layer via hole is defined on the insulating layer via hole by using the exposure and etching technology.

The dielectric layer via hole, the insulating layer via hole, and the buffer layer are a nested structure. The dielectric layer via hole is communicated with to the insulating layer via hole. The dielectric layer via hole, the insulating layer via hole, and the buffer layer form a second via hole. Because an internal diameter of the dielectric layer via hole is greater than the internal diameter of the insulating layer via hole, and the internal diameter of the insulating layer via hole is greater than the internal diameter of the buffer layer via hole, the second via hole is a ladder-shaped via hole with an internal diameter sequentially reducing from top to bottom. The second via hole provides a connection channel for a subsequent third metal layer.

S7, a step of manufacturing the third metal layer, wherein the third metal layer is manufactured on a top surface of the dielectric layer by the physical vapor deposition method. The third metal layer penetrates the second via hole and is electrically connected to the first metal layer. The third metal layer acts as a structural layer of a testing electric circuit. The third metal layer, the second metal layer, and the first metal layer constitute a testing electric circuit wiring. The testing electric circuit wiring is located in a terminal region.

S8, a step of manufacturing a passivation layer, wherein the passivation layer is manufactured on top surfaces of the third metal layer and the dielectric layer. The passivation layer provides an effect of smoothing a surface, which is conducive to manufacturing of subsequent layers, prevents problems such as bubble generation during the manufacturing process, and improves manufacturing yield. A passivation layer via hole is defined on the passivation layer by the exposure and etching technology. The passivation layer via hole is disposed relatively to the third metal layer to provide a channel for a subsequent pixel electrode.

S9, a step of manufacturing the pixel electrode, wherein the pixel electrode is manufactured on a top surface of the passivation layer and in the passivation layer via hole. The pixel electrode is electrically connected to the third metal layer through the passivation layer via hole.

The technical effect of the manufacturing method of the array substrate of this embodiment is to manufacture a wire wound resistor from the first metal layer to replace a wire wound resistor of the original second metal layer, so that the second metal layer only needs to be electrically connected to the first metal layer, reducing an accommodating space of the testing electric circuit wiring, further reducing a width of the bottom bezel of the display device, reducing an area of a non-display region of the display device, and improving the screen-to-body ratio of the display device.

A display device is further provided in the embodiment, including the array substrate illustrated in FIG. 2 to FIG. 5. The array substrate includes a terminal region. A testing electric circuit wiring is disposed in the terminal region. The testing electric circuit wiring includes a first metal layer 2, a second metal layer 5, and a third metal layer 7.

The array substrate further includes a base substrate 1, a buffer layer 3, an insulating layer 4, a dielectric layer 6, a passivation layer 8, and a pixel electrode 9.

The base substrate 1 exerts a substrate function and is generally a hard substrate such as a glass substrate.

The first metal layer 2 is disposed on a top surface of the base substrate 1, acts as a light shielding layer of a poly-Si channel of a TFT, and acts as a signal transmitting line for testing electric current. The first metal layer 2 is a wire wound resistor (referring to FIG. 3).

The buffer layer 3 is disposed on top surfaces of the first metal layer 2 and the base substrate 1 and provides a buffer effect. A plurality of buffer layer via holes 31 are defined on the buffer layer 3 and act as connection channels of the first metal layer 2, the second metal layer 5, and the third metal layer 7.

The insulating layer 4 is disposed on a top surface of the buffer layer 3. The insulating layer 4 is a gate insulating layer, which provides an insulating effect. Insulating layer via holes 41 are defined on the insulating layer 4. The insulating layer via holes 41 and the buffer layer via holes 31 are defined relatively and are communicated with each other. The insulating layer via holes 41 and the buffer layer via holes 31 are nested structures. Internal diameters of the insulating layer via holes 41 are greater than internal diameters of the buffer layer via holes 31. One of the buffer layer via holes 31 and one of the insulating layer via holes 41 defined relatively are connected to each other to form a first via hole 10 (referring to FIG. 4). The first via hole 10 is a ladder-shaped via hole with a larger top internal diameter and a smaller bottom internal diameter. The first via hole 10 acts as a connection channel of the first metal layer 2, the second metal layer 5, and the third metal layer 7.

The second metal layer 5 is disposed on part of a top surface of the insulating layer 4 and in the first via hole 10. The second metal layer 5 is connected to the first metal layer 2 through the first via hole 10. The second metal layer acts as a gate electrode wiring.

The dielectric layer 6 is disposed on the top surfaces of the insulating layer 4 and the second metal layer 5 to provide the insulating effect. Dielectric layer via holes 61 are defined on the dielectric layer 6. The dielectric layer via holes 61 are defined relatively to the insulating layer via holes 41 and are communicated with the insulating layer via holes 41 and the buffer layer via holes 31. One of the insulating layer via holes 61, another insulating layer via hole 41, and another buffer layer via hole 31 are communicated with each other to form a second via hole 20 (referring to FIG. 5). The second via hole 20 provides a channel for the connection between the third metal layer 7 and the first metal layer 2.

The third metal layer 7 is disposed on a top surface of the dielectric layer 6 and in the second via hole 20. The third metal layer 7 is electrically connected to the first metal layer 2 through the second via hole 20. The third metal layer 7 acts as a structural layer of the testing electric circuit.

A passivation layer 8 is disposed on top surfaces of the third metal layer 7 and the dielectric layer 6. The passivation layer 8 provides effect of smoothing a surface, which is conducive to manufacturing subsequent layers, prevents problems such as bubble generation during the manufacturing process, and improves manufacturing yield. A plurality of passivation layer via holes are defined on the passivation layer 8. The passivation layer via holes are disposed relatively to the third metal layer 7 and act as connection channels between the pixel electrode 9 and the third metal layer 7.

The pixel electrode 9 is disposed on top surfaces of the passivation layer 8 and the third metal layer 7, and is electrically connected to the third metal layer 7 through the passivation layer via holes.

The beneficial effect of the display device of this embodiment is that the first metal layer is a wire wound resistor, replacing a wire wound resistor of the original second metal layer, so that the second metal layer only needs to be electrically connected to the first metal layer, reducing an accommodating space of the testing electric circuit wiring, further reducing a width of the bottom bezel of the display device, reducing an area of a non-display region of the display device, and improving the screen-to-body ratio of the display device.

In the above embodiments, the description of each embodiment has its emphasis, and for some embodiments that may not be detailed, reference may be made to the relevant description of other embodiments.

The array substrate, the manufacturing method thereof, and the display device provided by the embodiments of present disclosure are described in detail above. This article uses specific cases for describing the principles and the embodiments of the present disclosure, and the description of the embodiments mentioned above is only for helping to understand the method and the core idea of the present disclosure. It should be understood by those skilled in the art, that it can perform changes in the technical solution of the embodiments mentioned above, or can perform equivalent replacements in part of technical characteristics, and the changes or replacements do not make the essence of the corresponding technical solution depart from the scope of the technical solution of each embodiment of the present disclosure.

What is claimed is:

1. An array substrate, comprising a terminal region,
   wherein a testing electric circuit wiring is disposed in the terminal region, and the terminal region comprises a pixel electrode,
   wherein the testing electric circuit wiring comprises:
   a first metal layer configured to act as a light shielding layer and a signal transmitting line for a testing electric current of the testing electric circuit wiring;
   a second metal layer configured to act as a gate electrode wiring, to transmit the testing electric current to gate electrodes; and
   a third metal layer configured to act as a testing electric circuit, wherein the third metal layer is electrically connected to the pixel electrode, and the testing electric current is capable of transmitting between the third metal layer and the pixel electrode;
   wherein the second metal layer is connected to the first metal layer, and
   the third metal layer is connected to the first metal layer.

2. The array substrate as claimed in claim 1, wherein the array substrate comprises:
   a base substrate, wherein the first metal layer is disposed on a surface of a side of the base substrate, and the first metal layer is a winding-type;
   a buffer layer disposed on a surface of a side of the first metal layer away from the base substrate;
   an insulating layer disposed on a surface of a side of the buffer layer away from the first metal layer;
   the second metal layer disposed on a surface of a side of the buffer layer away from the first metal layer;
   a dielectric layer disposed on a surface of a side of the second metal layer away from the buffer layer; and
   the third metal layer disposed on a surface of a side of the dielectric layer away from the buffer layer.

3. The array substrate as claimed in claim 2, wherein
   a plurality of buffer layer via holes are defined on the buffer layer;
   a plurality of insulating layer via holes are defined on the insulating layer;
   the plurality of insulating layer via holes and the plurality of buffer layer via holes are defined relatively;
   a plurality of dielectric layer via holes are defined on the dielectric layer; and
   the plurality of dielectric layer via holes and the plurality of insulating layer via holes are defined relatively.

4. The array substrate as claimed in claim 3, wherein
   one of the buffer layer via holes and one of the insulating layer via holes defined relatively are communicated with each other to form a first via hole, and
   another one of the buffer layer via holes, another one of the insulating layer via holes, and one of the dielectric layer via holes defined relatively are communicated with each other to form a second via hole.

5. The array substrate as claimed in claim 3, wherein
   internal diameters of the buffer layer via holes are less than internal diameters of the insulating layer via holes; and
   the internal diameters of the insulating layer via holes are less than internal diameters of the dielectric layer via holes.

6. The array substrate as claimed in claim 5, wherein
the second metal layer is partially disposed in the first via hole and connected to the first metal layer; and
the third metal layer is partially disposed in the second via hole and connected to the first metal layer.

7. Manufacturing method of an array substrate for manufacturing the array substrate as claimed in claim 1, comprising following steps:
providing a base substrate in a step of providing the base substrate;
manufacturing a first metal layer on a top surface of the base substrate in a step of manufacturing the first metal layer, wherein the first metal layer is a winding-type;
manufacturing a buffer layer on a top surface of the first metal layer in a step of manufacturing the buffer layer;
manufacturing an insulating layer on a top surface of the buffer layer in a step of manufacturing the insulating layer;
manufacturing a second metal layer on a top surface of the insulating layer in a step of manufacturing the second metal layer;
manufacturing a dielectric layer on a top surface of the second metal layer in a step of manufacturing the dielectric layer; and
manufacturing a third metal layer on a top surface of the dielectric layer in a step of manufacturing the third metal layer, wherein the third metal layer, the second metal layer, and the first metal layer constitute a testing electric circuit wiring.

8. The manufacturing method of the array substrate as claimed in claim 7, wherein
in the step of manufacturing the buffer layer,
a layer of a buffer material is deposited on the top surface of the first metal layer, at least one buffer layer via hole is defined by using exposure and etching technology, and part of the first metal layer is exposed in the buffer layer via hole;
in the step of manufacturing the insulating layer,
a layer of an insulation material is deposited on the top surface of the buffer layer, at least one insulating layer via hole is defined on the buffer layer via hole by using the exposure and etching technology, the insulating layer via hole is communicated with the buffer layer via hole, and the insulating layer via hole and the buffer layer via hole form a first via hole; and
in the step of manufacturing the second metal layer,
the second metal layer is manufactured in the first via hole, and the second metal layer is connected to the first metal layer.

9. The manufacturing method of the array substrate as claimed in claim 8, wherein
in the step of manufacturing the dielectric layer,
a layer of an inorganic material is deposited on the top surfaces of the insulating layer and the second metal layer, a dielectric layer via hole is defined on the insulating layer via hole by using the exposure and etching technology, the dielectric layer via hole is communicated with the insulating layer via hole, and the dielectric layer via hole, the insulating layer via hole, and the buffer layer via hole form a second via hole; and
in the step of manufacturing the third metal layer,
the third metal layer is manufactured in the second via hole, and the third metal layer is connected to the first metal layer.

10. A display device, comprising an array substrate comprising a terminal region,
wherein a testing electric circuit wiring is disposed in the terminal region, and the terminal region comprises a pixel electrode,
wherein the testing electric circuit wiring comprises:
a first metal layer configured to act as a light shielding layer and a signal transmitting line for a testing electric current of the testing electric circuit wiring;
a second metal layer configured to act as a gate electrode wiring, to transmit the testing electric current to gate electrodes; and
a third metal layer configured to act as a testing electric circuit, wherein the third metal layer is electrically connected to the pixel electrode, and the testing electric current is capable of transmitting between the third metal layer and the pixel electrode;
wherein the second metal layer is connected to the first metal layer, and
the third metal layer is connected to the first metal layer.

* * * * *